US009658283B2

(12) United States Patent
Wu et al.

(10) Patent No.: US 9,658,283 B2
(45) Date of Patent: May 23, 2017

(54) RADIATOR MODULE SYSTEM FOR AUTOMATIC TEST EQUIPMENT

(71) Applicant: CHROMA ATE INC., Taoyuan County (TW)

(72) Inventors: Xin-Yi Wu, Taoyuan County (TW); Jui-Che Chou, Taoyuan County (TW); Meng-Kung Lu, Taoyuan County (TW); Chin-Yi Ou Yang, Taoyuan County (TW)

(73) Assignee: CHROMA ATE INC., Taoyuan County (TW)

( * ) Notice: Subject to any disclaimer, the term of this patent is extended or adjusted under 35 U.S.C. 154(b) by 277 days.

(21) Appl. No.: 14/669,783

(22) Filed: Mar. 26, 2015

(65) Prior Publication Data

US 2015/0198659 A1 Jul. 16, 2015

Related U.S. Application Data

(63) Continuation of application No. 13/415,254, filed on Mar. 8, 2012, now Pat. No. 9,121,898.

(30) Foreign Application Priority Data

Nov. 22, 2011 (TW) .............................. 100142741 A

(51) Int. Cl.
*G01R 31/28* (2006.01)
*H05K 7/20* (2006.01)

(52) U.S. Cl.
CPC ...... *G01R 31/2877* (2013.01); *G01R 31/2874* (2013.01); *H05K 7/20136* (2013.01); *H05K 7/20254* (2013.01)

(58) Field of Classification Search
None
See application file for complete search history.

(56) References Cited

U.S. PATENT DOCUMENTS

| 5,205,132 A * | 4/1993 | Fu ..................... G05D 23/1917 236/15 BB |
| 5,977,785 A * | 11/1999 | Burward-Hoy ....... F28D 9/0093 324/754.03 |
| 2004/0189280 A1 * | 9/2004 | Mirkhani ........... G01R 31/2851 324/750.09 |

* cited by examiner

*Primary Examiner* — Melissa Koval
*Assistant Examiner* — Felicia Farrow
(74) *Attorney, Agent, or Firm* — Locke Lord LLP; Tim Tingkang Xia, Esq.

(57) ABSTRACT

A radiator module system for automatic test equipment, including a test arm and a closed-loop circulating cooling device disposed on the test arm. The test arm includes a test head, and an internal channel is formed within and passing through the test head. The closed-loop circulating cooling device includes an inlet and an outlet, respectively connected to the internal channel; a conduit connecting the inlet and the outlet, such that the conduit and the internal channel form a closed-loop circulating channel in which a working fluid flows; a cooling device in contact with the conduit, configured to perform heat dissipation to the working fluid flowing within the conduit; and a driving source configured to drive the working fluid to flow within the closed-loop circulating channel. The working fluid is driven by the driving source to flow within the closed-loop circulating channel to perform heat dissipation.

16 Claims, 12 Drawing Sheets

RADIATOR MODULE SYSTEM FOR AUTOMATIC TEST EQUIPMENT

CROSS-REFERENCE TO RELATED APPLICATIONS

This application is a continuation application of U.S. patent application Ser. No. 13/415,254, filed Mar. 8, 2012, entitled "RADIATOR MODULE SYSTEM FOR AUTOMATIC TEST EQUIPMENT" by Xin-Yi Wu, Jui-Che Chou, Meng-Kung Lu, and Chin-Yi Ou Yang, which itself claims the priority to and the benefit of Taiwan Patent Application No. 100142741, filed Nov. 22, 2011. The disclosures of the above identified applications are incorporated herein by reference in their entirety.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

FIELD OF THE INVENTION

The present invention relates generally to heat dissipation technology for automatic test equipment, and, in particular, to a radiator module system for an automatic test equipment for performing cooling circulations on heat energy generated by a device under test (DUT) during testing.

BACKGROUND OF THE INVENTION

Generally speaking, a test head for device tests can be installed on a robot arm and force a device under test (DUT) tightly stressed by downward pressure into a test area inside an electric or layered test equipment. However, due to certain incapability in the heat sinking mechanism of the conventional test head for high performance integrated circuit (IC) DUT, upon performing electric tests or layered tests, the heat sinking effect of the test head may be insufficient and even reduced after multiple test operations, which may cause adverse influences on the heat dissipation result for heat generated by the IC DUT thus accordingly leading to occurrence of IC device impairment.

In order to resolve the above-said issues, in the industry it is common to prepare an additional cooling machine for connecting to the test head thereby removing the accumulated heat energy from the test head; however, such an additionally added cooling machine takes up significant space and purchase fees for such machines may also undesirably increase the manufacture costs. Besides, the cooling machine needs to connect multiple lines to the test head so as to conduct away the generated heat energy to perform effective heat exchanges. But, unfortunately, in this way the complexity among such pipelines become inevitable, and this complication tends to induce troubles in operation and maintenance processes. Hence, this approach of placing additional cooling machines for heat dissipation will lead to occurrence of many unnecessary problems.

As such, it should be an optimal solution in case that a circulating cooling device can be combined with the test arm having a test head such that it is possible to allow the circulating cooling device to directly perform heat exchanges on heat energy generated by a DUT tightly stressed by downward pressure applied with the test arm so as to dissipate the generated heat energy.

SUMMARY OF THE INVENTION

One aspect of the present invention relates to a radiator module system, which includes a test arm and a closed-loop circulating cooling device disposed on the test arm. The test arm includes a test head to perform a test on a device under test (DUT), and an internal channel is formed within the test head such that the internal channel passes through the test head. The closed-loop circulating cooling device includes: an inlet and an outlet, respectively connected to the internal channel; a conduit connecting the inlet and the outlet, such that the conduit and the internal channel form a closed-loop circulating channel, where a working fluid flows within the closed-loop circulating channel; a cooling device in contact with the conduit, configured to perform heat dissipation to the working fluid flowing within the conduit; and a driving source configured to drive the working fluid to flow within the closed-loop circulating channel. The test arm and the closed-loop circulating cooling device are synchronously movable such that the closed-loop circulating channel is not entangled due to movement of the test arm. The working fluid is driven by the driving source to flow within the closed-loop circulating channel by way of: flowing through the internal channel within the test head to absorb heat generated at the test head during the test on the DUT, entering the conduit from the internal channel through the inlet, flowing through the conduit such that the cooling device performs heat dissipation to dissipate the heat, and re-entering the internal channel within the test head from the conduit through the outlet.

In certain embodiments, the closed-loop circulating cooling device further includes a set of fans disposed in a parallel direction relative to the cooling device.

In certain embodiments, the closed-loop circulating cooling device further includes a housing, where the inlet and the outlet, the conduit, the cooling device, the driving source and the set of fans are all installed inside the housing.

In certain embodiments, the cooling device includes a set of heat sinks in contact with the conduit within the cooling device.

In certain embodiments, the conduit is arranged between the cooling device and the driving source.

A further aspect of the present invention realtes to an automatic test equipment for performing tests on a device under test (DUT). In certain embodiments, the automatic test equipment includes a test mechanism, which includes a plurality of test arms; and a plurality of closed-loop circulating cooling devices, each disposed correspondingly on one of the test arms. Each of the test arms includes a test head to perform the tests on the DUT, and an internal channel is formed within the test head such that the internal channel passes through the test head. Each of the closed-loop circulating cooling devices includes: an inlet and an outlet, respectively connected to the internal channel within the corresponding test head; a conduit connecting the inlet and the outlet, such that the conduit and the internal channel within the corresponding test head form a closed-loop circulating channel for the corresponding test head, where a working fluid flows within the closed-loop circulating channel; a cooling device in contact with the conduit, configured to perform heat dissipation to the working fluid flowing within the conduit; and a driving source configured to drive the working fluid to flow within the closed-loop circulating channel. For each of the test arms, the test arm and the closed-loop circulating cooling device disposed on the test arm are synchronously movable such that the closed-loop circulating channel for the corresponding test head is not entangled due to movement of the test arm For each of the closed-loop circulating cooling devices, the working fluid is driven by the driving source to flow within the closed-loop circulating channel by way of: flowing through the internal channel within the corresponding test head to absorb heat generated at the corresponding test head during the tests on the DUT, entering the conduit from the internal channel through the inlet, flowing through the conduit such that the cooling device performs heat dissipation to dissipate the heat, and re-entering the internal channel within the test head from the conduit through the outlet.

In certain embodiments, each of the closed-loop circulating cooling devices further includes: a set of fans disposed in a parallel direction relative to the cooling device.

In certain embodiments, each of the closed-loop circulating cooling devices further includes: a housing, wherein the inlet and the outlet, the conduit, the cooling device, the driving source and the set of fans are all installed inside the housing.

In certain embodiments, for each of the closed-loop circulating cooling devices, the cooling device includes: a set of heat sinks in contact with the conduit within the cooling device.

In certain embodiments, for each of the closed-loop circulating cooling devices, the conduit is arranged between the cooling device and the driving source.

In certain embodiments, for each of the closed-loop circulating cooling devices, the test head is configured to perform the tests on the DUT when the DUT is disposed in a test area.

In certain embodiments, the automatic test equipment further includes: a plurality of transport devices, configured to transport the DUT into and out of the test area. In certain embodiments, each of the transport devices has a test socket for insertion of the DUT.

In certain embodiments, the automatic test equipment further includes: a set of pick-up arms, configured to move the DUT from a first carrier tray at an entry area to the transport devices, and to move the DUT from the transport devices to a second carrier tray at an exit area. In certain embodiments, the set of pick-up arms is a set of X-Y-axis pickup arms.

In certain embodiments, each of the test arms is a Z-axis test arm movable along a direction substantially perpendicular to a moving direction of the set of X-Y-axis pick-up arms, such that the test head tightly presses the DUT to perform the tests.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment, and wherein.

DETAILED DESCRIPTION OF THE PREFERRED EMBODIMENT

Figure 1A:
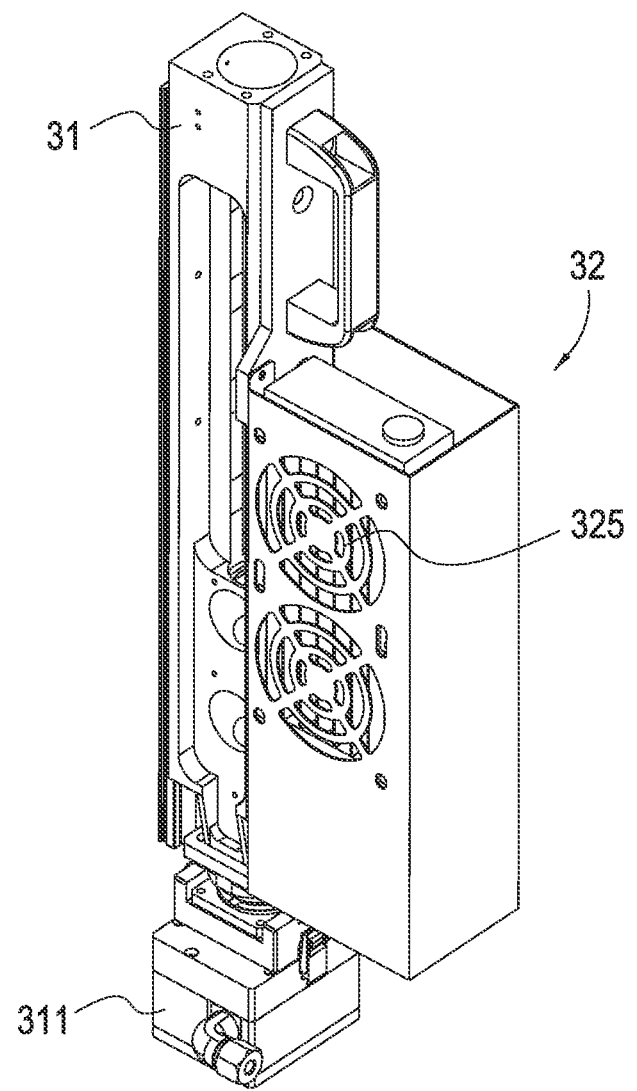
FIG. 1A shows a structure view of a radiator module system for automatic test equipment according to certain embodiments of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views.

As used in the description herein and throughout the claims that follow, the meaning of "a", "an", and "the" includes plural reference unless the context clearly dictates otherwise. Moreover, titles or subtitles may be used in the specification for the convenience of a reader, which shall have no influence on the scope of the present invention.

The meaning of the technical and scientific terms as described herein can be clearly understood by a person of ordinary skill in the art.

Figure 1B:
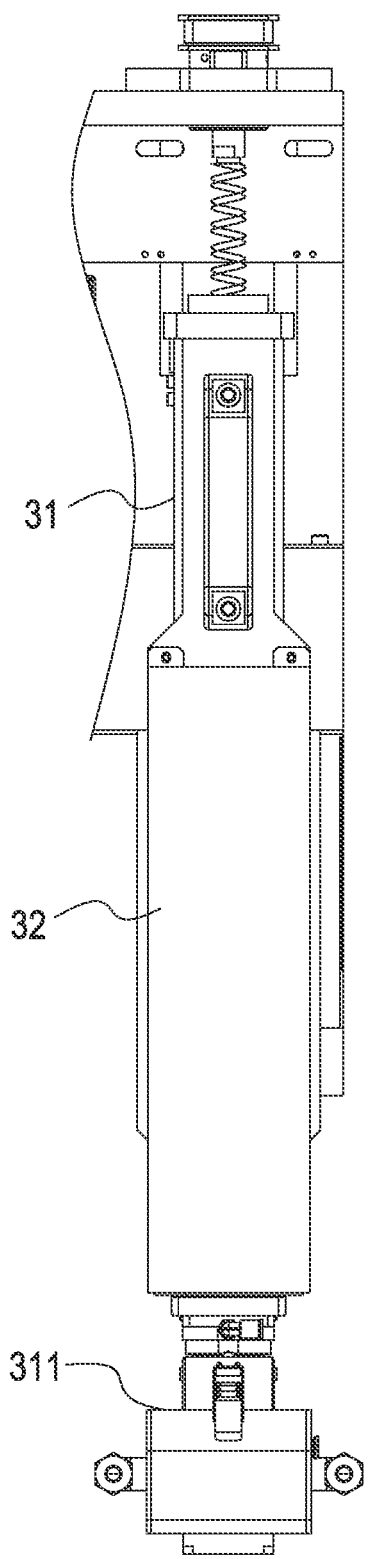
FIG. 1B shows a front view of the radiator module system for automatic test equipment according to certain embodiments of the present invention.
Figure 2A:
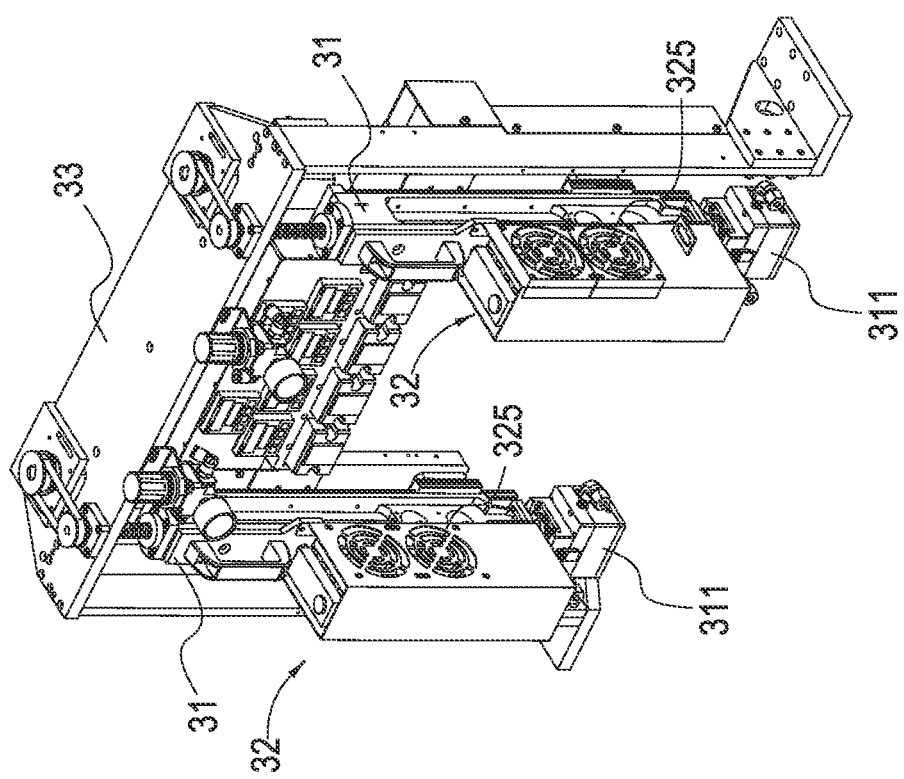
FIG. 2A shows a partial assembly structure view of a radiator module system for automatic test equipment according to certain embodiments of the present invention.
Figure 2B:
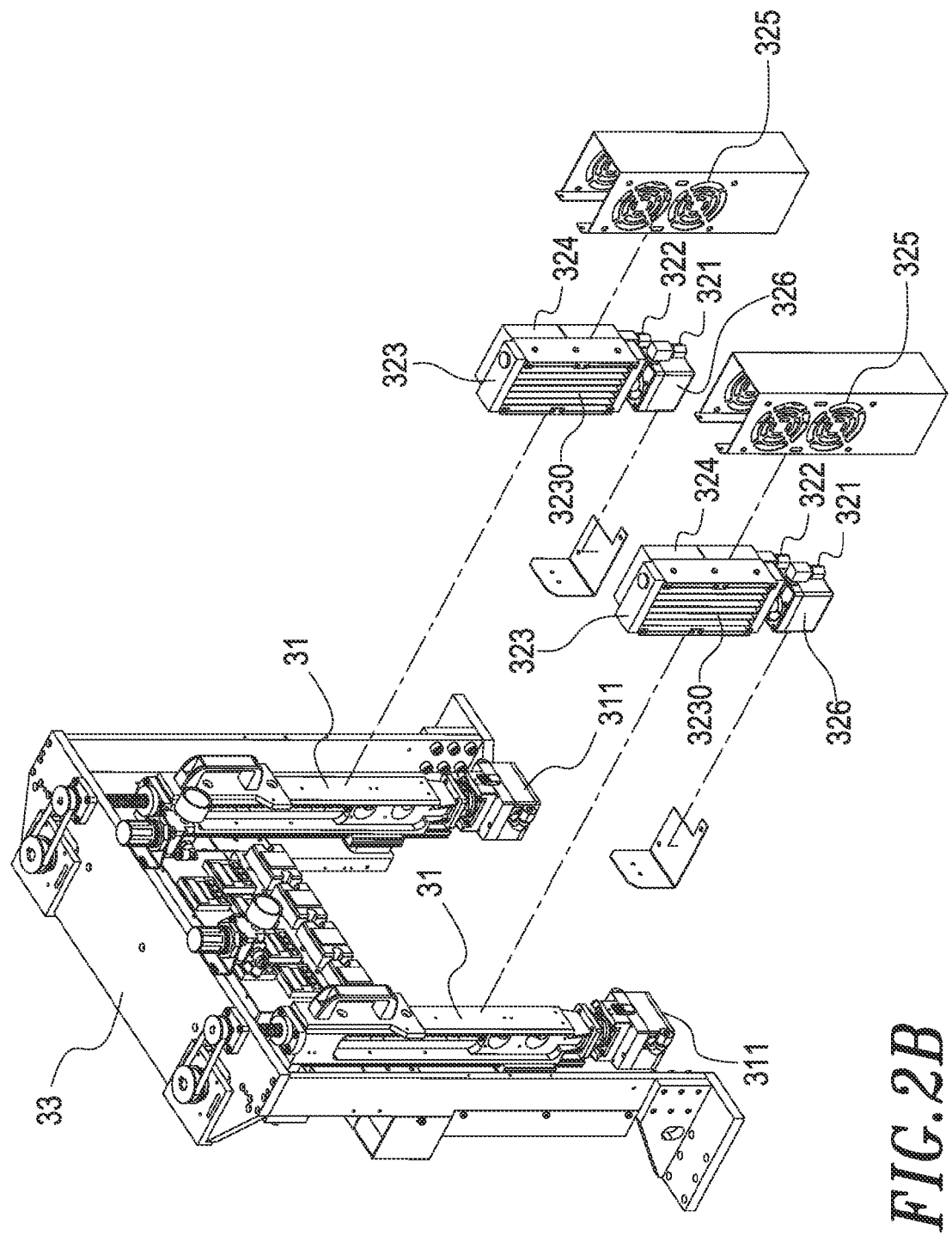
FIG. 2B shows a partial disassembly structure view of a radiator module system for automatic test equipment according to certain embodiments of the present invention.

FIGS. 1A and 1B show a structure view and a front view, respectively, for the radiator module system in an automatic test equipment according to certain embodiments of the present invention. FIGS. 2A and 2B show a partial assembly structure view and a partial disassembly structure view, respectively, of a radiator module system for automatic test equipment according to certain embodiments of the present invention. As shown in the figures, the radiator module system comprises a closed-loop circulating cooling device 32 and at least one test arm 31, and the closed-loop circulating cooling device 32 is installed on the test arm 31. The test arm 31 has a test head 311 located at the front end of the test arm 31. As shown in FIGS. 2A and 2B, the test arm 31 is a part of a test mechanism 33, which includes a plurality of test arms 31, and each test arm 31 has a corresponding closed-loop circulating cooling device 32.

As shown in the partial disassembly structure view of FIG. 2B, the closed-loop circulating cooling device 32 includes an outlet 321 and an inlet 322, a cooling device 323, a set of fans 324 installed in a direction parallel to the cooling device 323 as well as a driving source 326 for driving the working fluid. In certain embodiments, the driving source 326 may be a motor, a pump and the like. Although not explicitly shown in the figures, an internal channel is formed within the test head 311 such that the internal channel passes through the test head 311. Further, although not explicitly shown in the figures, the closed-loop circulating cooling device 32 includes a conduit connecting the inlet 321 and the outlet 322, such that the conduit and the internal channel form a closed-loop circulating channel, where a working fluid flows within the closed-loop circulating channel. In certain embodiments, by combining the closed-loop circulating cooling device 32 onto the test arm 31, the closed-loop circulating cooling device 32 may be configured to synchronously move along with the test arm 31 when the test arm 31 moves. Thus, the pipeline of the closed-loop circulating channel (i.e., the conduit of the closed-loop circulating cooling device 32 and the internal channel within the test head 311) will not be entangled due to the movement of the test arm 31, thus preventing the pipeline from becoming loose or falling off from the test equipment.

In certain embodiments, the cooling device 323 further includes a set of heat sinks 3230 and in contact with the conduit (not shown) within the cooling device 323 for heat dissipation. As shown in FIGS. 1B and 2B, it can be seen that the conduit having the outlet 321 and the inlet 322 as its ends is arranged between the cooling device 323 and the driving source 326 and internally includes the working fluid. In addition, the outlet 321 and the inlet 322 are respectively connected to the internal channel formed within the test head 311 located at the front end of the test arm 31, e.g., through conduit connections. Therefore, the circulation of the working fluid within the closed-loop circulating channel (the conduit and the internal channel) provides the test head 311 with the heat removing feature. Hence, the working fluid is driven by the driving source 326 to flow within the closed-loop circulating channel by way of: flowing through the internal channel within the test head 311 to absorb heat generated at the test head 311 during the test on the DUT; entering the conduit from the internal channel through the inlet 322; flowing through the conduit such that the cooling device 323 performs heat dissipation to dissipate the heat; and re-entering the internal channel within the test head 311 from the conduit through the outlet 321. The heat dissipation may be repeatedly working in cycle to perform heat sinking or heat exchange processes on the DUT by means of the test head 311. However, one of ordinary skill in the art can appreciate that the direction of the working fluid can be also reversed with respect to the previous descriptions to achieve the same effect.

As the working fluid enters into the conduit inside the cooling device 323 via the inlet 322, since heat energy generated in tests has been absorbed by the working fluid, the closed-loop circulating cooling device 32 circulates and exchanges heat energy generated during tests by the DUT tightly contacted and pressed by the test head 311. Following this, such heat energy can be exchanged and dissipated by the heat sinks 3230 installed on the conduit between the outlet 321 and the inlet 322 and the fans 324 can be activated to create airflows to discharge heat energy.

In certain embodiments, as shown in FIGS. 2A and 2B, the outlet 321, the inlet 322, the cooling device 323, the fans 324 and the driving source 326 may be installed inside a housing 325, and the closed-loop circulating cooling device 32 can be connected to the test arm 31 on the test mechanism 33. Thus, the test arm 31 is allowed to move up/down in a Z-axis direction. Consequently, as lowering the test arm 31 to cause the test head 311 to tightly press the DUT during tests, the closed-loop circulating cooling device 32 can perform circulation exchanges on heat energy generated during tests from the DUT tightly contacted and pressed with the test head 311 of the test arm 31.

Because the present invention is essentially applied to the automatic test equipment, to specifically demonstrate the innovative design with regards to the radiator module system for automatic test equipment according to the present invention, a test operation view is shown as below for illustrations from entry, test to exit phases.

FIGS. 3A to 3H show test operation views of a radiator module system for automatic test equipment according to certain embodiments of the present invention. As shown in FIGS. 3A to 3H, the automatic test equipment is divided into a plurality of areas, including an entry area 1, a test area 3 and an exit area 4. A first carrier tray 11 is provided at the entry area 1 to carry one or more DUTs 61. Similarly, a second carrier tray 41 is provided at the exit area 4 to carry one or more tested DUTs 62. The test arm 31 and the closed-loop circulating cooling device 32 are located in the test area 3 to perform the tests on the DUTs 61. It should be noted that, although FIGS. 3A to 3H show only one test arm 31 and one closed-loop circulating cooling device 32 in the test area 3, the automatic test equipment may include multiple test arms 31 and multiple closed-loop circulating cooling devices 32. The test arm 31 is movable along a Z-axis (the vertical direction as shown in FIGS. 3A to 3H), which is substantially perpendicular to the X-Y-axis (the horizontal direction as shown in FIGS. 3A to 3H). One or more transport devices 2 may be provided to transport the DUT 61 into and out of the test area 3. Further, a set of X-Y-axis pick-up arms 5 may be provided to move the DUT 61 from the first carrier tray 11 at the entry area 1 to the transport devices 2, and to move the tested DUT 62 from the transport devices 2 to the second carrier tray 41 at the exit area 4 along a moving direction, which is the X-Y-axis direction (i.e., the horizontal direction as shown in FIGS. 3A to 3H). The number of the X-Y-axis pick-up arms 5 may vary based on need. In certain embodiments, the transport devices may include a test socket 21 for insertion of the DUT 61. In certain embodiments, each of the DUTs 61 and/or the tested DUTs 62 may be, for example, an electronic component.

Figure 3A:
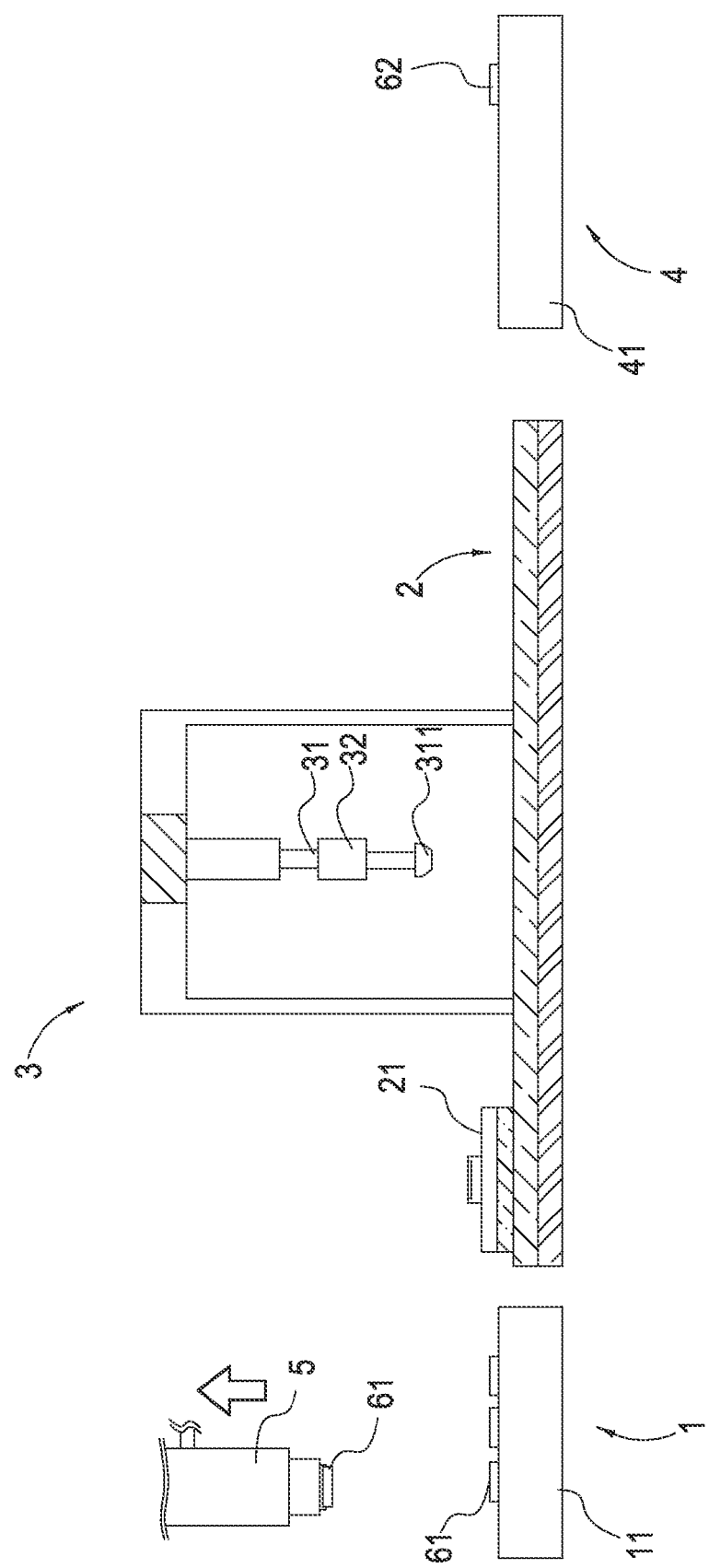
FIGS. 3A to 3H show test operation views of a radiator module system for automatic test equipment according to certain embodiments of the present invention.
Figure 3B:
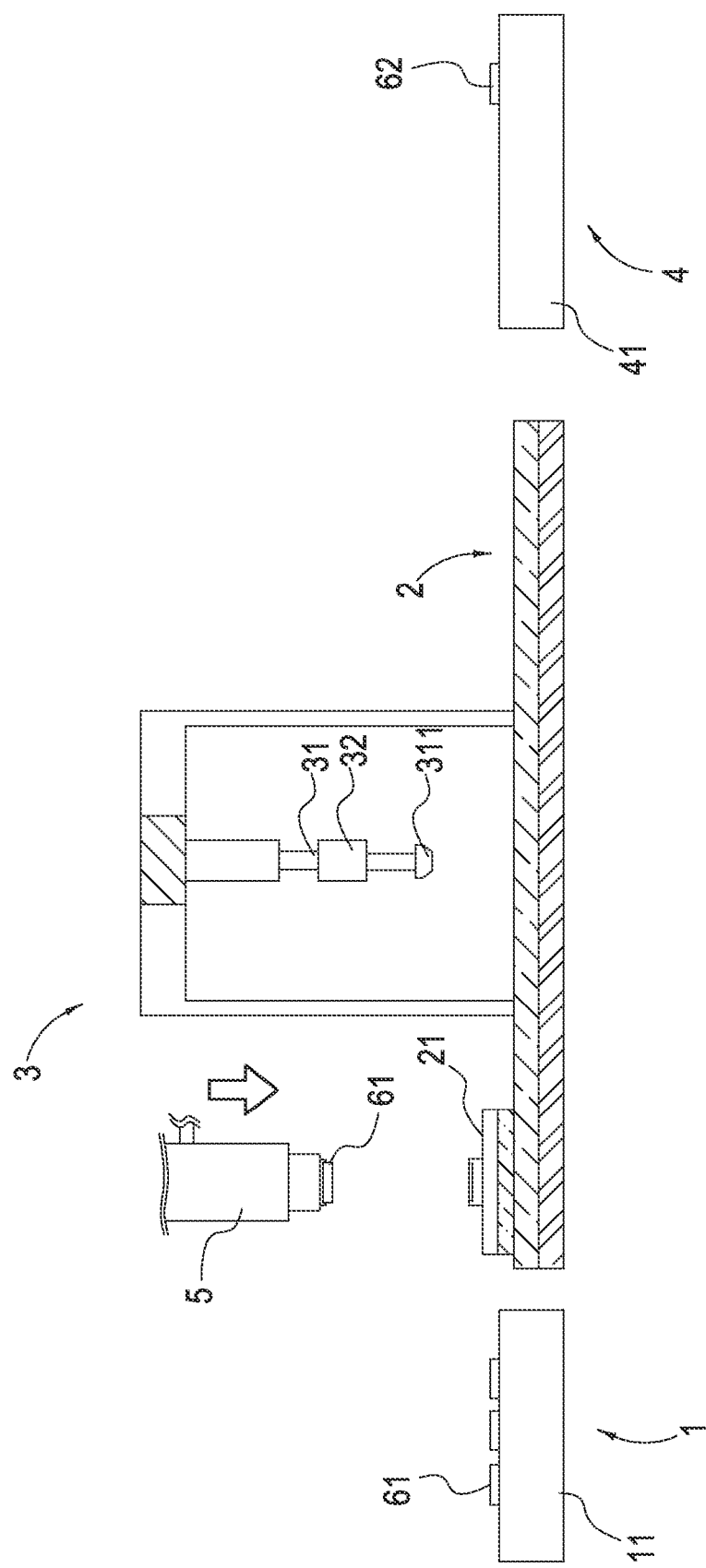
Figure 3C:
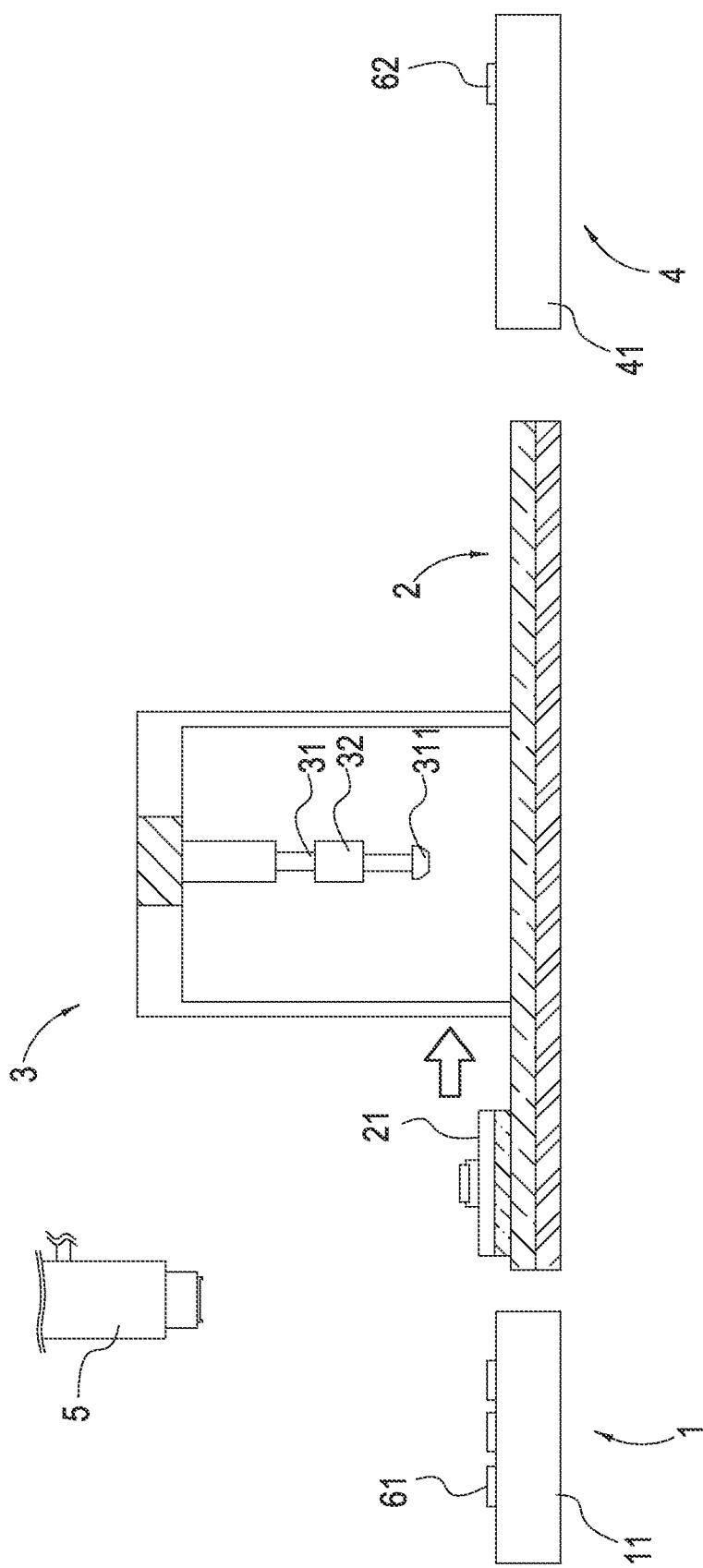
Figure 3D:
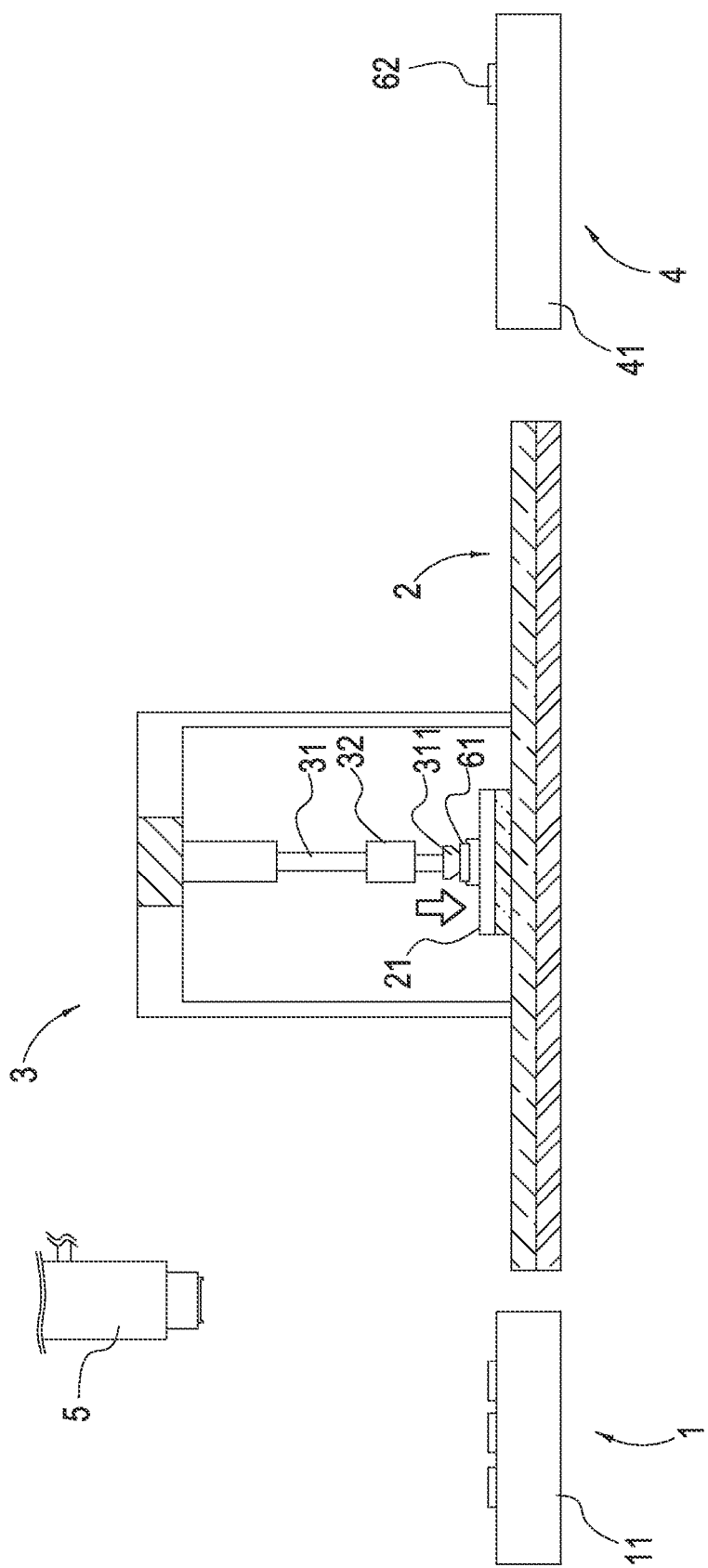

As shown in FIGS. 3A and 3B, it can be observed that the X-Y-axis pick-up arm 5 first moves a DUT 61 from the first carrier tray 11 at the entry area 1 to the transport device 2, such that the DUT 61 is received by the transport device 2 with the test socket 21. Then, as shown in FIG. 3C, the transport device 2 transfers the DUT 61 into the test area 3, and the DUT 61 is subject to test operations. Then, as shown in FIG. 3D, the Z-axis test arm 31 lowers toward the DUT 61 to cause the test head 311 to tightly press the DUT 61 for performing testing. During testing, time heat energy generated during the tests by the DUT 61 can be removed through cooling circulations performed by the closed-loop circulating cooling device 32.

Figure 3E:
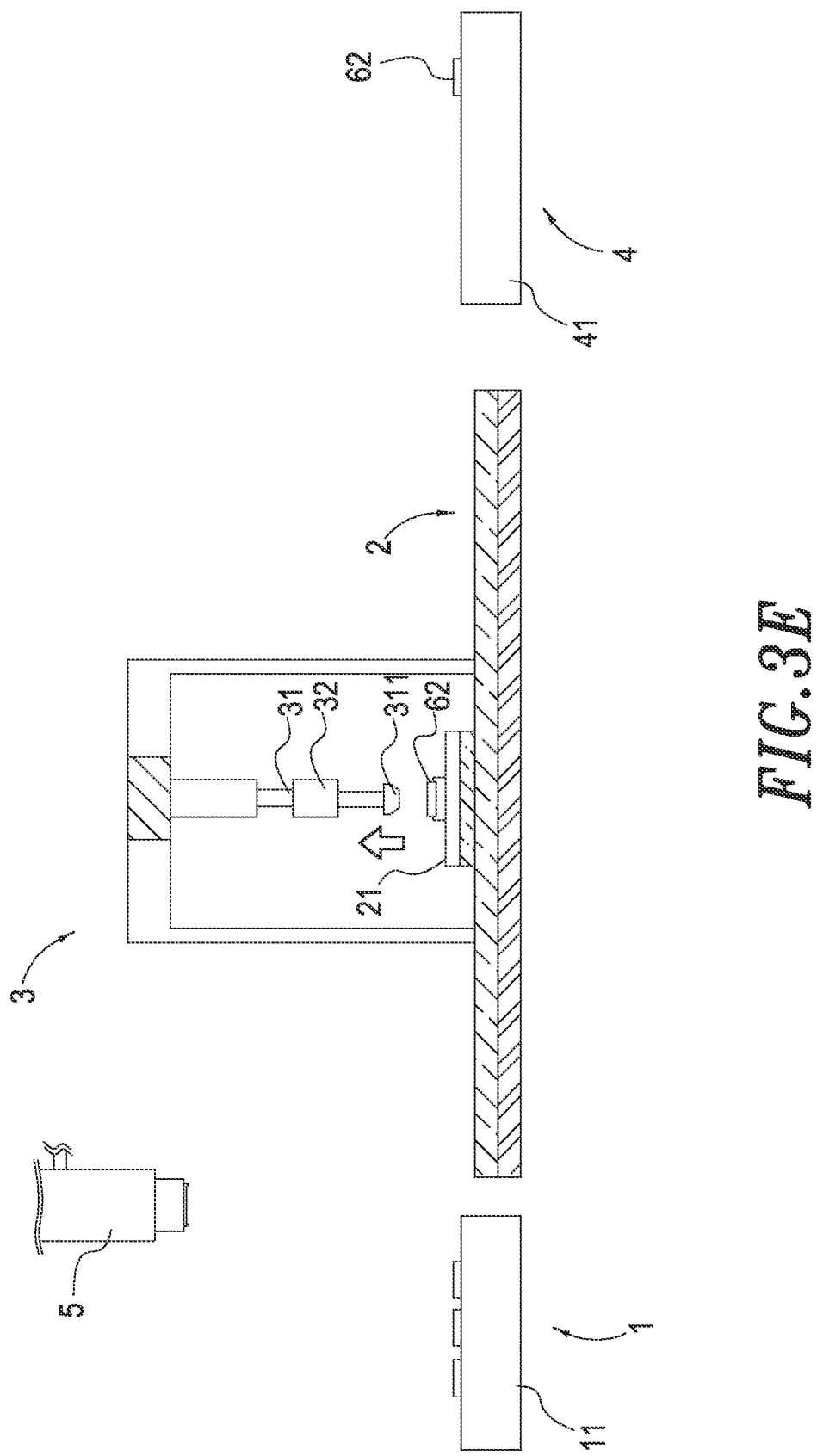
Figure 3F:
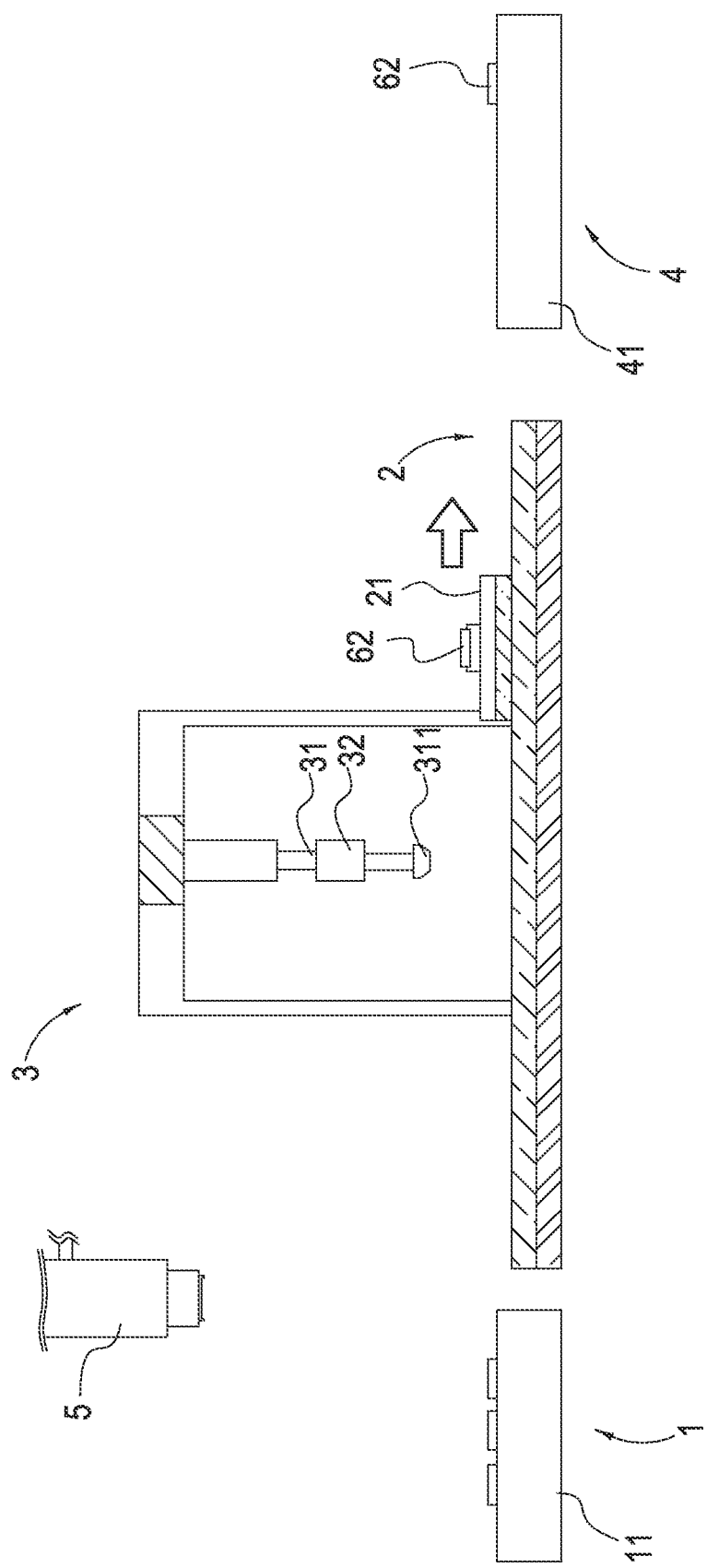
Figure 3G:
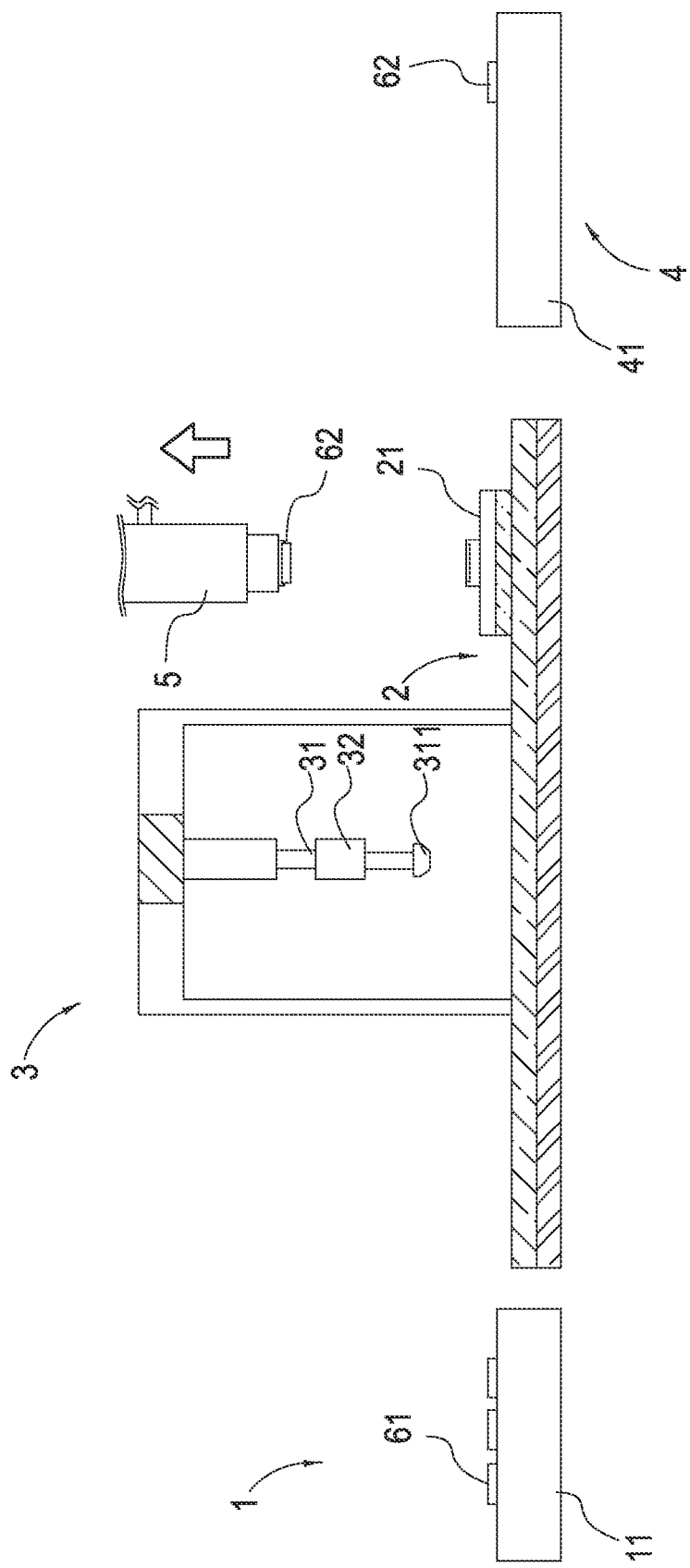
Figure 3H:
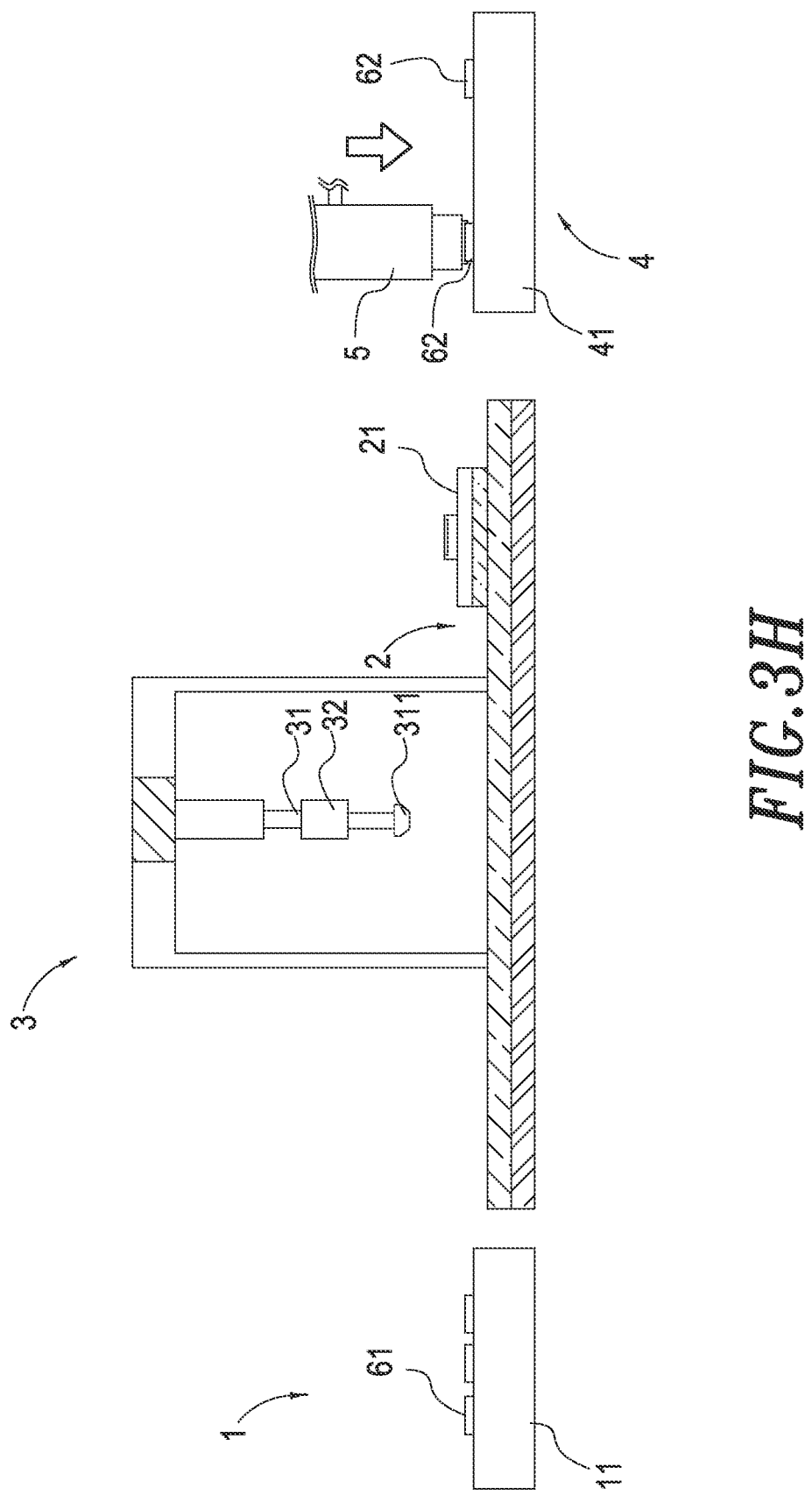

Following this, as shown in FIG. 3E, the Z-axis test arm 31 rises up such that the tested DUT (e.g., an electronic component) 62 can be taken away from the test area 3 with the socket 21 of the transport device 2. As shown in FIG. 3F, the transport device 2 transfers the DUT 61 out of the test area 3. Finally, as shown in FIGS. 3G and 3H, the X-Y-axis pick-up arm 5 (which may be the same X-Y-axis pick-up arm 5 as shown in FIGS. 3A and 3B, or may be a different X-Y-axis pick-up arm 5) moves the tested DUT (e.g., an electronic component) 62 from the socket 21 of the transport device 2 to the exit area 4 and assorts it onto the second carrier tray 41 at the exit area 4.

In comparison with other conventional technologies, the radiator module system for automatic test equipment according to certain embodiments of the present invention provides the following beneficial features:

1. in certain embodiments of the present invention, a closed-loop circulating cooling device is combined with the test arm having a test head such that it is possible to allow the closed-loop circulating cooling device to directly perform heat exchanges on heat energy generated by a DUT tightly stressed by downward pressure applied with the test arm so as to dissipate the generated heat energy;

2. certain embodiments of the present invention do not require installations of additional and expensive cooling machines for heat sinking, thus further resolving issues concerning operation and maintenance processes due to line complexity caused by the conventional cooling machine;

3. through combining the closed-loop circulating cooling device onto the test arm, the present invention allows the closed-loop circulating cooling device to synchronously move in the Z-axis direction of the test arm when the test arm shifts in order to improve the conventional approach of connecting pipelines or conduits of an external cooling device thereto, thus preventing occurrence of pipeline entanglement when the test arm moves in the Z-axis direction which may lead to loose or falloff problems.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A radiator module system, comprising:
 a test arm comprising a test head to perform a test on a device under test (DUT), wherein an internal channel is formed within the test head such that the internal channel passes through the test head; and
 a closed-loop circulating cooling device disposed on the test arm, wherein the closed-loop circulating cooling device comprises:
  an inlet and an outlet, respectively connected to the internal channel;
  a conduit connecting the inlet and the outlet, such that the conduit and the internal channel form a closed-loop circulating channel, wherein a working fluid flows within the closed-loop circulating channel;
  a cooling device in contact with the conduit, configured to perform heat dissipation to the working fluid flowing within the conduit; and
  a driving source configured to drive the working fluid to flow within the closed-loop circulating channel;
 wherein the test arm and the closed-loop circulating cooling device are synchronously movable such that the closed-loop circulating channel is not entangled due to movement of the test arm; and
 wherein the working fluid is driven by the driving source to flow within the closed-loop circulating channel by way of:
  flowing through the internal channel within the test head to absorb heat generated at the test head during the test on the DUT,
  entering the conduit from the internal channel through the inlet,
  flowing through the conduit such that the cooling device performs heat dissipation to dissipate the heat, and
  re-entering the internal channel within the test head from the conduit through the outlet.

2. The radiator module system according to claim 1, wherein the closed-loop circulating cooling device further comprises:
 a set of fans disposed in a parallel direction relative to the cooling device.

3. The radiator module system according to claim 2, wherein the closed-loop circulating cooling device further comprises:
 a housing, wherein the inlet and the outlet, the conduit, the cooling device, the driving source and the set of fans are all installed inside the housing.

4. The radiator module system according to claim 1, wherein the cooling device comprises:
 a set of heat sinks in contact with the conduit within the cooling device.

5. The radiator module system according to claim 1, wherein the conduit is arranged between the cooling device and the driving source.

6. An automatic test equipment for performing tests on a device under test (DUT), the automatic test equipment comprising:
 a test mechanism, comprising a plurality of test arms, each of the test arms comprising a test head to perform the tests on the DUT, wherein an internal channel is formed within the test head such that the internal channel passes through the test head; and
 a plurality of closed-loop circulating cooling devices, each disposed correspondingly on one of the test arms, wherein each of the closed-loop circulating cooling devices comprises:
  an inlet and an outlet, respectively connected to the internal channel within the corresponding test head;
  a conduit connecting the inlet and the outlet, such that the conduit and the internal channel within the corresponding test head form a closed-loop circulating channel for the corresponding test head, wherein a working fluid flows within the closed-loop circulating channel;
  a cooling device in contact with the conduit, configured to perform heat dissipation to the working fluid flowing within the conduit; and
  a driving source configured to drive the working fluid to flow within the closed-loop circulating channel;
 wherein for each of the test arms, the test arm and the closed-loop circulating cooling device disposed on the test arm are synchronously movable such that the closed-loop circulating channel for the corresponding test head is not entangled due to movement of the test arm; and
 wherein for each of the closed-loop circulating cooling devices, the working fluid is driven by the driving source to flow within the closed-loop circulating channel by way of:
  flowing through the internal channel within the corresponding test head to absorb heat generated at the corresponding test head during the tests on the DUT,
  entering the conduit from the internal channel through the inlet,
  flowing through the conduit such that the cooling device performs heat dissipation to dissipate the heat, and re-entering the internal channel within the test head from the conduit through the outlet.

7. The automatic test equipment according to claim 6, wherein each of the closed-loop circulating cooling devices further comprises:
   a set of fans disposed in a parallel direction relative to the cooling device.

8. The automatic test equipment according to claim 7, wherein the closed-loop circulating cooling device further comprises:
   a housing, wherein the inlet and the outlet, the conduit, the cooling device, the driving source and the set of fans are all installed inside the housing.

9. The automatic test equipment according to claim 6, wherein for each of the closed-loop circulating cooling devices, the cooling device comprises:
   a set of heat sinks in contact with the conduit within the cooling device.

10. The automatic test equipment according to claim 6, wherein for each of the closed-loop circulating cooling devices, the conduit is arranged between the cooling device and the driving source.

11. The automatic test equipment according to claim 6, wherein for each of the closed-loop circulating cooling devices, the test head is configured to perform the tests on the DUT when the DUT is disposed in a test area.

12. The automatic test equipment according to claim 11, further comprising:
   a plurality of transport devices, configured to transport the DUT into and out of the test area.

13. The automatic test equipment according to claim 12, wherein each of the transport devices has a test socket for insertion of the DUT.

14. The automatic test equipment according to claim 12, further comprising:
   a set of pick-up arms, configured to move the DUT from a first carrier tray at an entry area to the transport devices, and to move the DUT from the transport devices to a second carrier tray at an exit area.

15. The automatic test equipment according to claim 14, wherein the set of pick-up arms is a set of X-Y-axis pickup arms.

16. The automatic test equipment according to claim 15, wherein each of the test arms is a Z-axis test arm movable along a direction substantially perpendicular to a moving direction of the set of X-Y-axis pick-up arms, such that the test head tightly presses the DUT to perform the tests.

* * * * *